(12) United States Patent
Samsonov et al.

(10) Patent No.: US 9,430,854 B2
(45) Date of Patent: Aug. 30, 2016

(54) SYSTEM AND METHOD FOR MODEL CONSISTENCY CONSTRAINED MEDICAL IMAGE RECONSTRUCTION

(75) Inventors: Alexey Samsonov, Madison, WI (US); Julia Velikina, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 384 days.

(21) Appl. No.: 13/531,523

(22) Filed: Jun. 23, 2012

(65) Prior Publication Data
US 2013/0343625 A1  Dec. 26, 2013

(51) Int. Cl.
| G06K 9/00 | (2006.01) |
| G06T 11/00 | (2006.01) |
| G01R 33/561 | (2006.01) |
| G01R 33/50 | (2006.01) |

(52) U.S. Cl.
CPC ......... *G06T 11/005* (2013.01); *G01R 33/5611* (2013.01); *G01R 33/50* (2013.01)

(58) Field of Classification Search
None
See application file for complete search history.

(56) References Cited

U.S. PATENT DOCUMENTS

| 7,477,770 | B2* | 1/2009 | Wehrli et al. ................ 382/131 |
| 7,986,438 | B2* | 7/2011 | Takahashi et al. .......... 358/1.9 |
| 8,150,122 | B2* | 4/2012 | Fenchel et al. ............. 382/128 |
| 8,310,233 | B2* | 11/2012 | Trzasko et al. ............. 324/309 |
| 8,391,643 | B2* | 3/2013 | Melbourne et al. ......... 382/294 |
| 2003/0006770 | A1* | 1/2003 | Smith .......................... 324/309 |
| 2006/0122480 | A1* | 6/2006 | Luo et al. .................... 600/407 |
| 2006/0253017 | A1* | 11/2006 | O'Donnell et al. ......... 600/410 |
| 2008/0197842 | A1* | 8/2008 | Lustig et al. ................ 324/307 |
| 2008/0292167 | A1* | 11/2008 | Todd et al. ................... 382/131 |
| 2008/0292194 | A1* | 11/2008 | Schmidt et al. ............. 382/217 |
| 2009/0161933 | A1* | 6/2009 | Chen ............................ 382/131 |
| 2009/0226067 | A1* | 9/2009 | Souza et al. ................. 382/131 |
| 2010/0052679 | A1* | 3/2010 | Zelinski et al. ............. 324/309 |
| 2011/0058719 | A1* | 3/2011 | Trzasko et al. ............. 382/131 |
| 2011/0282181 | A1* | 11/2011 | Wang et al. ................. 600/407 |
| 2012/0008844 | A1* | 1/2012 | Bilgin et al. ................ 382/131 |
| 2012/0027279 | A1* | 2/2012 | Avinash et al. ............. 382/131 |
| 2012/0081114 | A1* | 4/2012 | Weller et al. ................ 324/309 |
| 2012/0099774 | A1* | 4/2012 | Akcakaya ........... G06T 11/008 382/131 |
| 2012/0179028 | A1* | 7/2012 | Caravan et al. ............. 600/420 |
| 2013/0044960 | A1* | 2/2013 | Zhang et al. ................ 382/232 |

(Continued)

OTHER PUBLICATIONS

Sajan Goud Lingala et al. "Accelerated Dynamic MRI Exploiting Sparsity and Low-Rank Structure: k-t SLR" IEEE Transactions on Medical Imaging, vol. 30, No. 5, May 2011.*

(Continued)

*Primary Examiner* — Bhavesh Mehta
*Assistant Examiner* — Oneal R Mistry
(74) *Attorney, Agent, or Firm* — Quarles & Brady, LLP

(57) ABSTRACT

A method for reconstructing an image of a subject with a medical imaging system, such as a magnetic resonance imaging system, is provided. Medical image data is acquired from the subject with the medical imaging system, and one or more images of the subject are reconstructed from the medical image data while constraining the one or more images to be consistent with a signal model that relates image intensity values in the image to a free parameter that is associated with a physical property of the subject. The signal model may be an analytical signal model or an approximate signal model learned from acquired medical image data. The model consistency condition may be enforced using an operator that projects an image estimate onto the space of all functions satisfying the signal model.

20 Claims, 4 Drawing Sheets

(56) References Cited

U.S. PATENT DOCUMENTS

2013/0121550 A1* 5/2013 Chang .................. G06T 11/003
 382/130
2014/0314293 A1* 10/2014 Dagher .................. A61B 5/055
 382/131

OTHER PUBLICATIONS

Anthony G. Christodoulou_†, S. Derin Babacan†, and Zhi-Pei Liang, "Accelerating Cardiovascular Imaging by Exploiting Regional Low-Rank Structure Via Group Sparsity" ISBI 2012, 978-1-4577-1858-8, May 2012.*
Block, et al., Model-Based Iterative Reconstruction for Radial Fast Spin-Echo MRI, IEEE Transactions on Medical Imaging, 2009, 28(11):1759-1769.
Bube, et al., Hybrid l(1)/l(2) Minimization with Applications to Tomography, Geophysics, 1997, 62(4):1183-1195.
Candes, et al., Sparsity and Incoherence in Compressive Sampling, Inverse Problems, 2007, 23:969-985.
Doneva, et al., Compressed Sensing Reconstruction for Magnetic Resonance Parameter Mapping, Magnetic Resonance in Medicine, 2010, 64:1114-1120.
Jung, et al., k-t FOCUSS: A General Compressed Sensing Framework for High Resolution Dynamic MRI, Magnetic Resonance in Medicine, 2009, 61(1):103-116.
Look, et al., Time Saving in Measurement of NMR and EPR Relaxation Times, Review of Scientific Instruments, 1970, 41(2):250-251.
Pedersen, et al., k-t PCA: Temporally Constrained k-t BLAST Reconstruction Using Principal Component Analysis, Magnetic Resonance in Medicine, 2009, 62(3):706-716.
Pruessmann, et al., Sense: Sensitivity Encoding for Fast MRI, Magnetic Resonance in Medicine, 1999, 42:952-962.
Samsonov, et al., Accelerated Serial MR Imaging in Multiple Sclerosis Using Baseline Scan Information, ISMRM, 2010, 4876.
Vitanis, et al., High Resolution Three-Dimensional Cardiac Perfusion Imaging Using Compartment-Based k-t Principal Component Analysis, Magnetic Resonance in Medicine, 2011, 65(2):575-587.
Wohlberg, et al., An Iteratively Reweighted Norm Algorithm for Minimization of Total Variation Functionals, IEEE Signal Processing Letters, 2007, 14(12):948-951.

* cited by examiner

SYSTEM AND METHOD FOR MODEL CONSISTENCY CONSTRAINED MEDICAL IMAGE RECONSTRUCTION

STATEMENT REGARDING FEDERALLY SPONSORED RESEARCH

This invention was made with government support under NS065034 awarded by the National Institutes of Health. The government has certain rights in the invention.

BACKGROUND OF THE INVENTION

The field of the invention is systems and methods for medical imaging, such as magnetic resonance imaging. More particularly, the invention relates to systems and methods for reconstructing a medical image or a series of medical images, such as those obtained with a magnetic resonance imaging system.

Quantitative MRI ("qMRI") parameter mapping often makes use of analytical models of magnetic resonance signals to offer unique information about tissue microenvironment. This unique information often yields imaging biomarkers that are more sensitive and specific to underlying pathology than regular anatomical MRI. However, most qMRI methods are often too time-consuming because they require multiple measurements along one or more additional parametric dimensions. For example, additional parametric dimensions may include acquiring image data at multiple different echo times for $T_2$ mapping and chemical species separation or at multiple different inversion times for $T_1$ mapping.

The requirement of acquiring measurements along parametric dimensions results in a several-fold increase in scan time, thereby limiting the clinical utility of qMRI techniques. As a result, k-space data is typically undersampled and an advanced reconstruction technique, such as parallel MRI, is used to accelerate qMRI data acquisitions. However, noise amplification, such as g-factor related noise-amplification in parallel MRI reconstruction, limits the practical imaging acceleration to a factor of 2-4 depending on a number of radio frequency ("RF") receiver coils.

A typical qMRI procedure produces parametric maps by first reconstructing images from acquired k-space data and then performing a pixelwise fit of these images to an analytical model of the underlying magnetic resonance signals. These two stages are decoupled and, as a result, the image reconstruction stage does not benefit from the prior knowledge of the signal behavior in the parametric dimension. In addition, because of this decoupling, errors accumulated during image reconstruction, such as those errors that may be related to undersampling artifacts, resolution loss, and amplified noise, propagate directly into the parametric maps.

One alternative is to directly estimate parametric maps by fitting the signal model to acquired k-space data. If the number of free parameters in the model is less than the number of measurements, sampling of individual datasets can go below the Nyquist limit. However, due to complexity and stability issues of such an estimation, the utility of parametric reconstruction is limited to cases when the signal evolution is described by simple models such as exponential functions.

Another strategy for using prior knowledge is to utilize the analytical signal model to "glue" images in the parametric dimension during reconstruction by relying on the assumption that for each pixel, signal evolution throughout the image series follows a predefined analytical dependence in the parametric dimension. This strategy may be also implemented using different types of linearization to reduce computational burden. If the linearized transform provides a good approximation to the analytical model for a range of target free parameter values, accurate reconstruction is possible in a feasible time. Linearization of the analytical models usually results in more degrees of freedom, which may result in representing a wider range of signals than the range implied by the source analytical models. Yet, such flexibility may come at the expense of constraining power, which limits acceleration capabilities of the techniques.

In currently available qMRI model-based methods, constraining the solution to the signal model happens in a "hard" fashion. That is, the solution is sought among the set of functions that strictly satisfy the chosen model, be it the original nonlinear analytical expression or its linearized version. However, this strategy may lead to detrimental performance due to inaccurate modeling, partial voluming, imaging imperfections, and motion artifacts, which impede accurate estimation of image series and parametric maps and convergence of the algorithms.

The clinical need for high spatial and temporal resolution in time-resolved magnetic resonance applications often necessitates image reconstruction from incomplete datasets because the total scan time is limited due to contrast passage or breath hold requirements. The advent of compressed sensing ("CS") provided a new sub-Nyquist sampling requirement for images accepting a sparse representation in some basis. However, the limited spatial sparsity of magnetic resonance images affords only moderate acceleration factors before CS-based reconstructions introduce image blurring and blocky artifacts. A better sparsification can be achieved by exploiting spatiotemporal correlations in the time series. In these methods, the underdetermined image reconstruction problem is regularized by making assumptions about the nature of temporal waveforms. The accuracy of reconstruction and achievable acceleration then depends on the validity of these assumptions in practice. In particular, the k-t PCA method, described by H. Pedersen, et al., in "k-t PCA: Temporally Constrained k-t BLAST Reconstruction Using Principal Component Analysis," *Magn. Reson. Med.*, 2009; 62(3):706-716, postulates that temporal behavior of different image regions can be described by a linear combination of several principal components, which are learned from low-resolution training data. Thus, there remains a need for a method that provides high spatial and temporal resolution images in time-resolved magnetic resonance applications in which incomplete or undersampled data sets are acquired.

SUMMARY OF THE INVENTION

The present invention overcomes the aforementioned drawbacks by providing a method for reconstructing a medical image in which the image reconstruction process is constrained to be consistent with a signal model.

It is an aspect of the invention to provide a method for reconstructing an image of a subject with a medical imaging system by acquiring medical image data from the subject with the medical imaging system and reconstructing an image of the subject from the acquired medical image data set while constraining the image to be consistent with a signal model that relates image intensity values in the image to a free parameter that is associated with a physical property of the subject. The medical imaging system may be, for example, a magnetic resonance imaging system. When the medical imaging system is a magnetic resonance imaging, the free parameter may include at least one of a longitudinal relaxation time, a transverse relaxation time, an apparent transverse relaxation time, a magnetization value, a magnetization transfer parameter, a diffusion coefficient, and a separated fat signal component, separated water signal component, or field map from chemical shift imaging applications, such as IDEAL.

It is another aspect of the invention that the signal model may be at least one of an analytical signal model and an approximate signal model generated from previously acquired medical image data.

It is yet another aspect of the invention that the signal model may be an approximate signal model generated from the acquired medical image data. The approximate signal model may be generated by reconstructing a series of low-resolution images from the medical image data and learning the approximate signal model from the reconstructed series of low-resolution images. The approximate signal model may be learned by forming an image intensity vector for each pixel location in an image matrix, forming a dictionary matrix from the image intensity vectors, and compressing the dictionary matrix to a few representative basis functions using at least one of principal component analysis or a k-SVD algorithm.

It is yet another aspect of the invention that the signal model may be an analytical signal model that is dependent on at least one control parameter of the medical imaging system. When the medical imaging system is a magnetic resonance imaging system, the at least one control parameter may include an echo time, a repetition time, or an inversion recovery time. The analytical signal model may include a plurality of signal models associated with different values of the at least one control parameter. An operator is computed from the analytical signal model and used to constrain the reconstruction of the image to be consistent with the analytical signal model.

It is yet another aspect of the invention that an approximate signal model may be based on a dictionary constructed from analytical signal models sampled on a dense grid of admissible values of quantitative parameters. This dictionary may then be compressed to a few representative basis functions using at least one of principal component analysis or a k-SVD algorithm.

The foregoing and other aspects and advantages of the invention will appear from the following description. In the description, reference is made to the accompanying drawings, which form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION OF THE INVENTION

Figure 1:
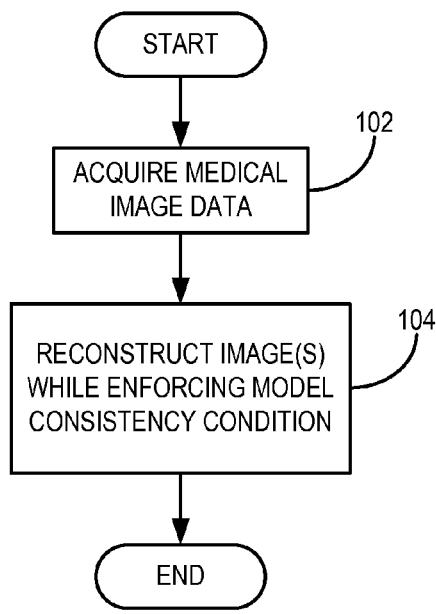
FIG. 1 is a flowchart setting forth the steps of an example of a method for medical image reconstruction.

A system and method for reconstructing medical images by employing a model consistency condition ("MOCCO") constraint are provided. By way of example, a series of medical images can be reconstructed from undersampled medical image data using the provided system and method, particularly where the medical imaging process includes acquiring medical image data that depends on a parameter that is either known from an analytical model or can be learned from training data. As a specific example, MOCCO-based image reconstruction is readily applicable to quantitative magnetic resonance imaging ("MRI") and various applications requiring time-resolved or spectrally-resolved medical imaging. MOCCO-based reconstruction can provide significant benefits over existing qMRI image reconstruction techniques, including improved regularization and acceleration. By way of example, the signal model used for the consistency constraint describes signal evolution in a serial dimension of the series of images, such as a parametric, temporal, or spectral dimension.

In the absence of relaxation effects, the MR signal collected by the $\gamma^{th}$ RF receiver coil out of the total number $n_c$ of coils, with sensitivity $C_\gamma(r)$, from an object, f(r) over a volume-of-interest ("VOI") may be modeled as $$s_\gamma(r) = \int_{VOI} e^{ik \cdot r} C_\gamma(r) f(r) \, dr \qquad (1)$$

where r and k are image space and k-space coordinate vectors, respectively. In its matrix form, and adding a term for the presence of noise errors, the Eqn. (1) can be written as $$s = Ef + n \qquad (2);$$

where f is the solution vector, S is a vector of k-space samples from all RF coil receivers, n is noise error, and E is the encoding matrix with elements corresponding to both Fourier and coil sensitivity encoding terms:

$$E_{(m,\gamma),\rho} = e^{ik_m \cdot r_\rho} C_\gamma(r_\rho) \qquad (3).$$

In Eqn. (3), $r_\rho$ and $k_m$ are the discretized spatial and k-space coordinates, respectively. In single-channel MRI acquisitions, the noise can generally assumed to be identically independently distributed ("i.i.d.") Gaussian noise. For multi-channel MRI acquisitions, noise whitening preprocessing using a separately measured noise covariance matrix may used to reduce noise errors. A signal-to-noise ratio ("SNR") optimized estimation of the image vector, f, from the k-space data, S, may be generally accomplished by enforcing data consistency in the least squares fashion:

$$\min_{\bar{f}} \|E\bar{f} - \bar{s}\|_2; \qquad (4)$$

where $\|\ldots\|_2$ is the $l_2$-norm. In general, the $l_p$-norm of a vector, x, may be written as $$\|x\|_p = \left(\sum_i |x_i|^p\right)^{1/p}. \qquad (5)$$

Accelerated MRI techniques often rely on undersampling k-space, which results in a poorly-conditioned or, in the case of significant undersampling, rank deficient encoding matrix, E. The poor conditioning of the encoding matrix renders solutions to Eqn. (4) sensitive to errors in the k-space data, and the potential rank deficiency of the encoding matrix means that Eqn. (4) will have non-unique solutions. To stabilize estimation of the image vector, f, the proposed model consistency condition can be used for regularization of the underdetermined image series reconstruction problem.

An image vector, f, can be described by an analytical signal model, such as $$f = S(\bar{c}, \bar{p}); \qquad (6)$$

where $\bar{c}$ are operator-controlled, or control, parameters, $\bar{p}$ are free parameters, which are parameters to be determined, and $S(\ldots)$ is a synthesis operator that, for a given set of control parameters maps the parametric maps into the corresponding image series. Control parameters include pulse sequence parameters, such as echo time ("TE"), repetition time ("TR"), and inversion recovery time ("TI"). Free parameters include, for example, longitudinal relaxation time, $T_1$; transverse relaxation time, $T_2$; apparent transverse relaxation time, $T_2^*$; magnetization, $M_0$; diffusion coefficients; magnetization transfer parameters; separated water signal contribution and separated fat signal contribution; fat fraction; and so on. A vector containing parametric maps indicative of the free parameters can be defined as $$\bar{p} = \begin{bmatrix} p_1 \\ \vdots \\ p_M \end{bmatrix}. \qquad (7)$$

These parametric maps are images whose pixel values are indicative of the spatial distribution of the corresponding free parameter. For example, a $T_1$ map is an image whose pixel values are represented by the estimated $T_1$ value at the spatial location associated with the respective pixel locations. Model-based qMRI data acquisitions may be described as a sampling of the space of control parameters. Thus, a vector of control parameters each corresponding to an individual measurement can be defined as $$\bar{c} = [\bar{c}_1, \ldots, \bar{c}_N] \qquad (8).$$

Letting $$\bar{f} = \begin{bmatrix} f_1 \\ \vdots \\ f_N \end{bmatrix}; \qquad (9)$$

be a vector that contains a parametric image series corresponding to the image acquisition defined by the control parameters, $\bar{c}$, the parametric maps, $\bar{p}$, can be determined through the following equation:

$$\bar{p} = \tilde{S}_{\bar{c}}(\bar{f}) \qquad (10);$$

where $\tilde{S}_{\bar{c}}(\ldots)$ is an analysis operator that maps the image series, $\bar{f}$, to the parametric maps, $\bar{p}$. The following relationship holds true for any parametric map:

$$\tilde{S}_{\bar{c}}(S_{\bar{c}}(\bar{p})) = \bar{p} \qquad (11);$$

so it follows that $$\tilde{S}_{\bar{c}} S_{\bar{c}} = I \qquad (12);$$

where I is the identity matrix. However, the converse of Eqn. (11) is only true if each pixel of the image series, $\bar{f}$, conforms to the model $S(\bar{c}; \bar{p})$ for the free parameter vector, $\bar{p}$. On the other hand, the superposition $S_{\bar{c}}\tilde{S}_{\bar{c}}$ is a projection operator onto the space of all functions $M(S_{\bar{c}})$ satisfying the model. If M<N, then the analysis operator, $\tilde{S}$, is the inverse of the synthesis operator on $M(S_{\bar{c}})$, which leads to the proposed model consistency condition: an image series, $\bar{f}$, satisfies the analytical model with experiment design, $\bar{c}$, if and only if $$S_{\bar{c}}(\tilde{S}_{\bar{c}}(\bar{f})) = \bar{f} \qquad (13).$$

The condition in Eqn. (13) can be enforced by minimizing the $l_p$-norm of the discrepancy between the image series and its projection on $M(S_{\bar{c}})$. By way of example, the following constrained minimization problem can be solved:

$$\min_{\bar{f}} \|S_c(\tilde{S}_c(\bar{f})) - \bar{f}\| \text{ subject to } \|E\bar{f} - \bar{s}\|_2 < \varepsilon; \qquad (14)$$

where $\varepsilon$ is a non-negative parameter. By way of example, p may equal one, in which instance the $l_p$-norm is the $l_1$-norm. The minimization in Eqn. (14) is constrained by the proposed model consistency condition subject to an additional constraint imposed by the data consistency condition. Alternatively, the following constrained minimization may also be solved:

$$\min_{\bar{f}} \|E\bar{f} - \bar{s}\|_2 \text{ subject to } \min_{\bar{f}} \|S_c(\tilde{S}_c(\bar{f})) - \bar{f}\|_1 \le t; \qquad (15)$$

where t is a non-negative parameter. The parameters $\varepsilon$ and t may be selected according to error and noise levels to make the image estimation more resilient to data errors and noise.

In general, both $S_{\bar{c}}$ and $\tilde{S}_{\bar{c}}$ are nonlinear operators and there is no closed form solution to the minimization problems in Eqns. (14) and (15). Thus, an iterative solution to Eqn. (14) or (15) may be too computationally expensive or even infeasible to obtain. To overcome this problem, a linear operator, D, and its pseudoinverse, $D^\dagger$, are introduced. These linear operators approximate the actions of $S_{\bar{c}}$ and $\tilde{S}_{\bar{c}}$ on the space $M(S_{\bar{c}})$ of model-consistent functions. Using these linear operators, Eqn. (13) can be rewritten as $$DD^\dagger \bar{f} = \bar{f} \qquad (16).$$

For practical implementations, an assumption can be made that a collection of functions whose span gives a close approximation of $M(S_{\bar{c}})$ exists. Such a collection, or dictionary, can be built by sampling the spaces of both the control parameters and the free parameters as follows:

$$D_T = [S(\bar{c}, \bar{p}_1) \ldots S(\bar{c}, \bar{p}_{N_T})] \qquad (17);$$

where the range of free parameters $\bar{p}_i$ for $i=1, \ldots, N_T$ covers a densely sampled range of admissible parameters.

The density of this sampling determines how well the span of $D_T$ approximates $M(S_c)$. Preferably, the rank, k, of $D_T$ should be less than N. The problem of finding a suitable solution of D can be formulated as $$\min_D \|(I - DD^\dagger)D_T\|_F; \quad (18)$$

such that $D^\dagger D = I$ and the rank of D is less than N. In Eqn. (18), $\|\ldots\|_F$ indicates the Frobenius norm, which for an arbitrary matrix, A, has the form $$\|A\|_F = \sqrt{\sum_i \sum_j |a_{ij}|^2}. \quad (19)$$

If the operator D is required to be orthogonal, then the minimization problem set forth in Eqn. (18) is generally equivalent to the problem of finding the k first principal components of $D_T$, $$D = U(:,1:k) \quad (20);$$

where U is a matrix of the principal components of $D_T$. Otherwise, D can be obtained as a result of k-clustering singular value decomposition (k-SVD) of $D_T$. Note that in the orthogonal case $D^\dagger = D^H$, that is, the pseudoinverse is the adjoint of the operator, which significantly simplifies computations. Using the linear operator, D, Eqn. (14) can be rewritten as $$\min_{\bar{f}} \|(DD^\dagger - I)\bar{f}\|_p \text{ subject to } \|E\bar{f} - \bar{s}\|_2; \quad (21)$$

and Eqn. (15) can be similarly rewritten. An unconstrained optimization problem may also be formulated by rewriting Eqn. (21) as $$\min_{\bar{f}} \{\|E\bar{f} - \bar{s}\|_2 + \lambda \|(DD^\dagger - I)\bar{f}\|_p\}; \quad (22)$$

for some parameter $\lambda > 0$. It is noted that the quadratic norm, $\|\ldots\|_2^2$, may be used in lieu of the $l_p$-norm; however, this norm may only be optimal when the analytic signal model or its linearization perfectly fits the medical image data in the least-squares sense. If some image pixels are not consistent with the chosen analytic signal model, high residual errors will be excessively penalized by the $l_2$-norm, which may bias the image estimation and propagate errors throughout the whole image series. Therefore, an $l_p$-norm with $1 \leq p < 2$ is advantageously used. Of these, the $l_1$-norm is generally the most forgiving to errors; however, it may be desirable to provide a tradeoff between efficient noise suppression provided by the quadratic norm and robustness against poor model fit provided by $l_1$-norm. This tradeoff can be balanced by using a hybrid $l_1/l_2$-norm, which for a vector, x, has the following form:

$$\|x\|_{l_1/l_2} = \sum_{i=1} \left( \sqrt{1 + \left|\frac{x_i}{\sigma}\right|^2} - 1 \right); \quad (23)$$

where σ is a cut-off parameter. As an example, the cut-off parameter may be selected as $\sigma = 0.6 \text{ std}(x)$.

As an alternative to the foregoing formulation, it is possible to solve Eqn. (15) by periodically updating an image series using the data consistency condition and model consistency condition in a manner similar to a projections onto convex sets ("POCS") method. This POCS-like approach can be formulated as $$\bar{f}^{(n+1)} = P_{\bar{p}} P_{\bar{s}} \bar{f}^{(n)} \quad (24);$$

where $P_{\bar{s}}$ is the projection on the set of images with predefined data and $P_{\bar{p}}$ is the generalized projection on the set of images that are consistent with an analytical signal model. These projections may be defined as follows:

$$P_s \bar{f} = f + E^H(s - Ef); \quad (25)$$

$$P_{\bar{p}} \bar{f} = S_{\bar{c}} \left( \arg\min_{\bar{p}} \|S_{\bar{c}}(\bar{p}) - \bar{f}\|_2 \right). \quad (26)$$

In the Cartesian sense, the P operator is equivalent to a data substitution operation in k-space. This model consistency projection may also be defined and implemented as follows:

$$P_{\bar{p}} \bar{f} = DD^\dagger \bar{f} \quad (27);$$

where $$D = U(:,1:L) \text{ or } D = KSVD(D_T, L, L) \quad (28).$$

In Eqn. (28), $KSVD(D_T, L, L)$ is the result of a k-clustering with singular value decomposition ("K-SVD") algorithm that yields a dictionary containing K atoms optimized to approximate any atom in the set, $D_T$, with L components. In Eqn. (28), it may be assumed that K=L. As before, the matrix, U in Eqn. (28) represents a matrix of principal components.

Additional constraints via projection operators can also be included to improve image reconstruction. For example, Eqn. (24) can be expanded to $$\bar{f}^{(n+1)} = P_c P_\phi H_\sigma P_{\bar{p}} P_{\bar{s}} \bar{f}^{(n)} \quad (29);$$

where $H_\sigma$ is an iterative thresholding projection operator, $P_\phi$ is a phase sharing constraint projection operator, and $P_c$ is an object support constraint projection operator, which sets image values that lie outside of the object to zero values.

The iterative thresholding projection operator, $H_\sigma$, may be defined as follows. First, the model consistency projection as defined by Eqn. (26) or (27) is performed. Then, the following residual is calculated:

$$\bar{r} = P_{\bar{p}} \bar{f} - \bar{f} \quad (30).$$

After the residual is calculated, the values of the image series estimate, $\bar{f}$, are modified as a function of the calculated residual. One example of how the image series estimate, $\bar{f}$, may be modified in this manner is as follows:

$$H_\sigma(\bar{f}) = \begin{cases} \bar{f} & \|\bar{r}\| \geq \sigma \\ P_{\bar{p}} \bar{f} & \|\bar{r}\| < \sigma. \end{cases} \quad (31)$$

The phase-sharing constraint projection operator, $P_\phi$, may be defined as follows. The image phase should be consistent between the acquisition of individual images in the parametric series. This property may be enforced using the phase-sharing constraint projection operator, which is equivalent to fitting the model to complex-valued data rather than magnitude data. If only magnitude fitting is possible, the phase-sharing projection may be performed as follows:

$$P_\phi \tilde{f} = |\tilde{f}| \cos(\phi_{sh} - \bar{\phi}) e^{i\phi_{sh}} \quad (32);$$

where $\phi_{sh}$ is the shared phase, which may be calculated as $$\phi_{sh} = \angle\left(\sum_i f_i\right). \quad (33)$$

Alternatively, the phase-sharing constraint projection operator may be defined with respect to a phase value, $\phi_0$, that is learned in a separate scan. Defining the operator in this way results in the following formulation $$P_\phi \tilde{f} = |\tilde{f}| \cos(\phi_0 - \bar{\phi}) e^{i\phi_0}. \quad (34).$$

The model consistency condition described above can also be extended to imaging applications in which there is no analytical signal model, but in which an approximate model can be derived from the images themselves. For example, the model consistency condition is applicable to time-resolved imaging applications, such as contrast-enhanced angiography, phase contrast imaging, cine cardiac imaging, and other real-time imaging techniques in which there is no theoretical or analytical model describing the dependence of signal intensity on time (temporal waveforms).

In such instances, due to the lack of an analytical or theoretical signal model, the basis waveforms for the operator, D, are determined not from a densely sampled dictionary, $D_T$, but are learned from a training dataset. An example of a training data set may include a low-resolution version of the image series. In this example, the dictionary matrix, $D_T$, in Eqn. (18) would be composed of temporal waveforms contained in the low-resolution images. Low-resolution images can be reconstructed from the acquired k-space data and do not need to be separately obtained. For example, the low-resolution images may be reconstructed from the central portions of the acquired k-space data. In this regard, the k-space sampling pattern should be defined so that each time frame samples the center of k-space. This sampling pattern occurs naturally with radial sampling techniques, but often needs to be purposely enforced in Cartesian sampling techniques.

Low-resolution images reconstructed from the same k-space data as the higher-resolution image series can be used to learn an approximate signal model because the low-resolution images are effectively the higher-resolution images convolved with some small kernel. Thus, the temporal waveforms in the low-resolution images are linear combinations of the temporal waveforms present in the higher-resolution image series. As a result, the same set of basis functions can provide a good approximation to both the low-resolution and higher-resolution image series simultaneously. As in the case of the linearized reconstruction technique described above, the basis functions can be obtained by means of either principal components analysis or K-SVD. After the basis functions are obtained, the remaining steps of the algorithm described for producing parametric maps are applicable for time-resolved imaging as well.

Referring now to FIG. 1, a flowchart setting forth the steps of an example of a method for reconstructing a series of images from acquired medical image data making use of a model consistency condition is illustrated. The method begins with the acquisition of the medical image data, as indicated at step 102. Next, as indicated at step 104, the series of images is reconstructed while constraining the reconstruction of each image to be consistent with a signal model that relates image intensity values in the reconstructed image to one or more variables or free parameters that are indicative of physical properties of the subject being imaged. This model consistency condition constrained image reconstruction may be implemented in different ways, a few examples of which are now provided. It is noted that for parametric imaging studies, the reconstructed series of images may be subsequently fit to the signal model in order to produce parametric maps.

Figure 2:
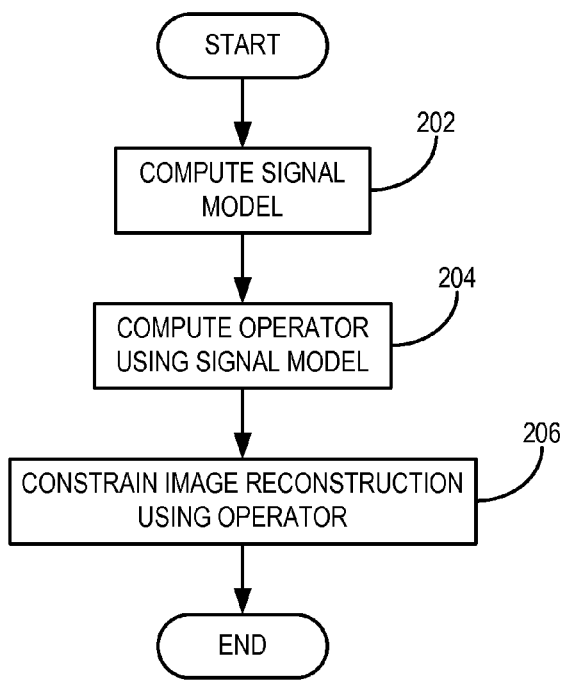
FIG. 2 is a flowchart setting forth the steps of an example of a method for a model consistency condition ("MOCCO") constrained image reconstruction.

Referring now to FIG. 2, a flowchart setting forth the steps of an example of a model consistency condition ("MOCCO") constrained image reconstruction method is illustrated. The method begins by computing a signal model to be used for the consistency condition, as indicated at step 202. As described above, the signal model may be an analytical model or an approximate model learned from acquired training data. The signal model is used to compute an operator used to constrain the image reconstruction, as indicated at step 204. By way of example, this computed operator projects an image onto the space of all functions that satisfy the signal model. The operator may be linear or nonlinear. The image reconstruction is then constrained using the computed operator, as indicated at step 206. By way of example, image reconstruction may utilize the nonlinear operator or the linear operator using one of the equations described above. In addition, the image reconstruction may proceed in the POCS-like manner also described above.

Figure 3:
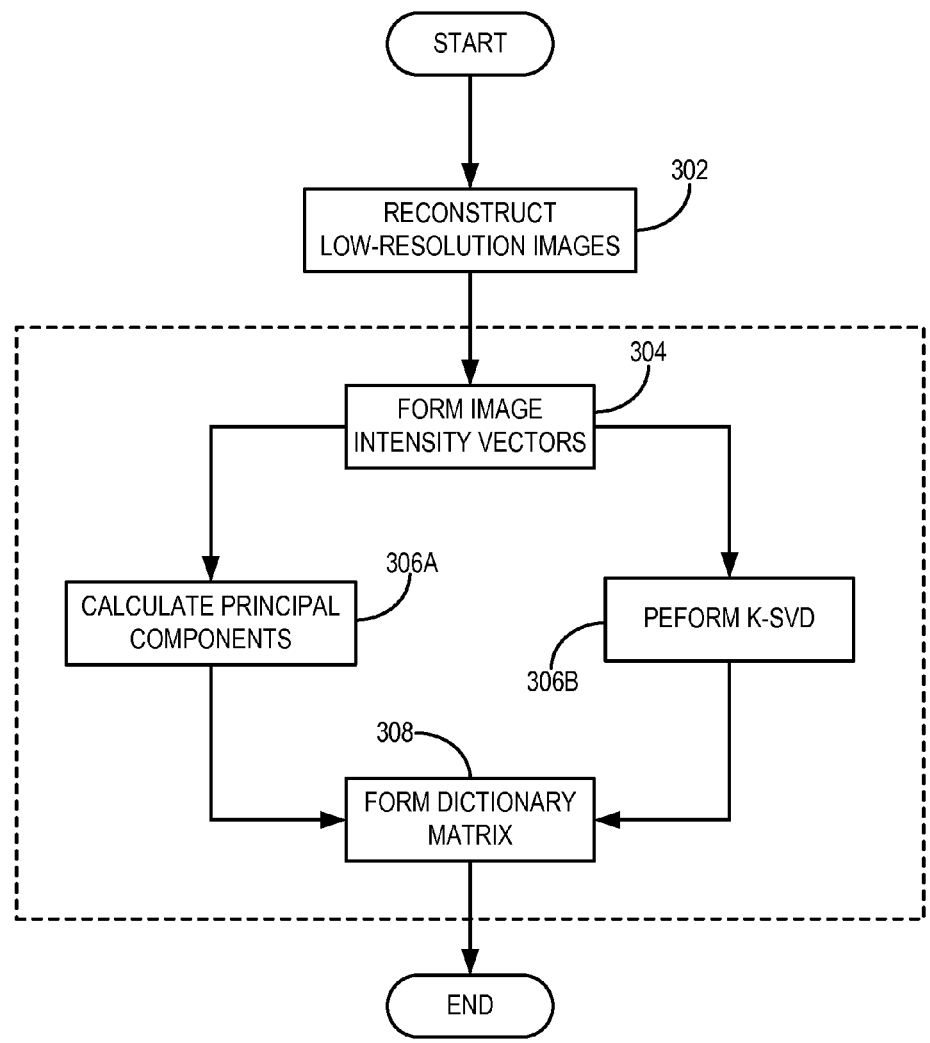
FIG. 3 is a flowchart setting forth the steps of an example of a method for computing an operator useful for enforcing a MOCCO constraint during image reconstruction using an approximate signal model.

Referring now to FIG. 3, a flowchart setting forth the steps of an example of a method for computing an operator use in the MOCCO constrained image reconstruction is illustrated. This method is useful for computing an approximate signal model in those instanced where there is no analytical signal model. The method includes reconstructing a series of low-resolution images from previously acquired medical image data, as indicated at step 302. The previously acquired medical image data may include the medical image data from which the target image series is also reconstructed. The approximate signal model is then learned from these low-resolution images by, for example, forming image intensity vectors for each pixel location, as indicated at step 304. Each image intensity vector is composed of image intensity values for a given pixel location over the course of the low-resolution images. For example, the image intensity vectors may represent a temporal waveform when the image series represents the same subject over a period of time. From the image intensity vectors, a basis for the operator used in the MOCCO constrained reconstruction is computed. This basis may be computed on the one hand by calculating the principal components of the image intensity vectors, as indicated at step 306A. On the other hand, the basis may also be computed using a K-SVD algorithm, as indicated as step 306B. The basis is used to generate a dictionary matrix, as indicated at step 308. This dictionary matrix is used to form the operator used in the MOCCO constrained image reconstruction.

Figure 4:
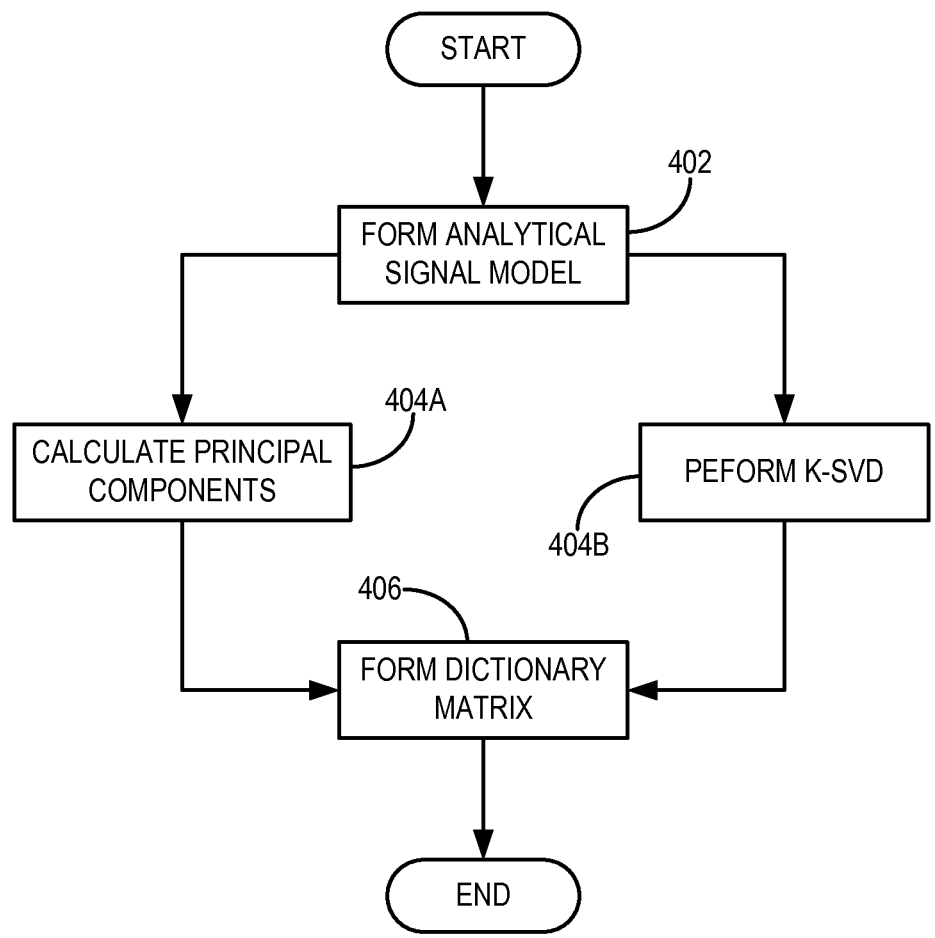
FIG. 4 is a flowchart setting forth the steps of an example of a method for computing an operator useful for enforcing a MOCCO constraint during image reconstruction using an analytical signal model.

Referring now to FIG. 4, a flowchart setting forth the steps of an example of another method for computing an operator for use in the MOCCO constrained image reconstruction is illustrated. This method is useful for when an analytical signal model is available. The method includes forming an analytical signal model that is dependent on at least one control parameter of the medical imaging system used to acquire the medical image data, as indicated at step 402. By way of example, the analytical signal model includes multiple signal models, each dependent on different values of a given control parameter. An example of such an analytical signal model useful for magnetic resonance imaging ("MRI") is $$S(TR, TE, M_0, T_1, T_2) = M_0(1 - e^{-TR/T_1})e^{-TE/T_2} \quad (35)$$

where the control parameters TR and TE are a repetition time and an echo time, respectively, and the free parameters $M_0$, $T_1$, and $T_2$ are magnetization, longitudinal relaxation time, and transverse relaxation time, respectively. Thus, in this example the analytical signal model would be computed from Eqn. (35) using multiple different values for echo time, repetition time, or both.

From the image analytical signal model, a basis for the operator used in the MOCCO constrained reconstruction is computed. This basis may be computed on the one hand by calculating the principal components of the analytical signal model, as indicated at step 404A. On the other hand, the basis may also be computed using a K-SVD algorithm, as indicated as step 404B. The basis is used to generate a dictionary matrix, as indicated at step 406. This dictionary matrix is used to form the operator used in the MOCCO constrained image reconstruction.

Figure 5:
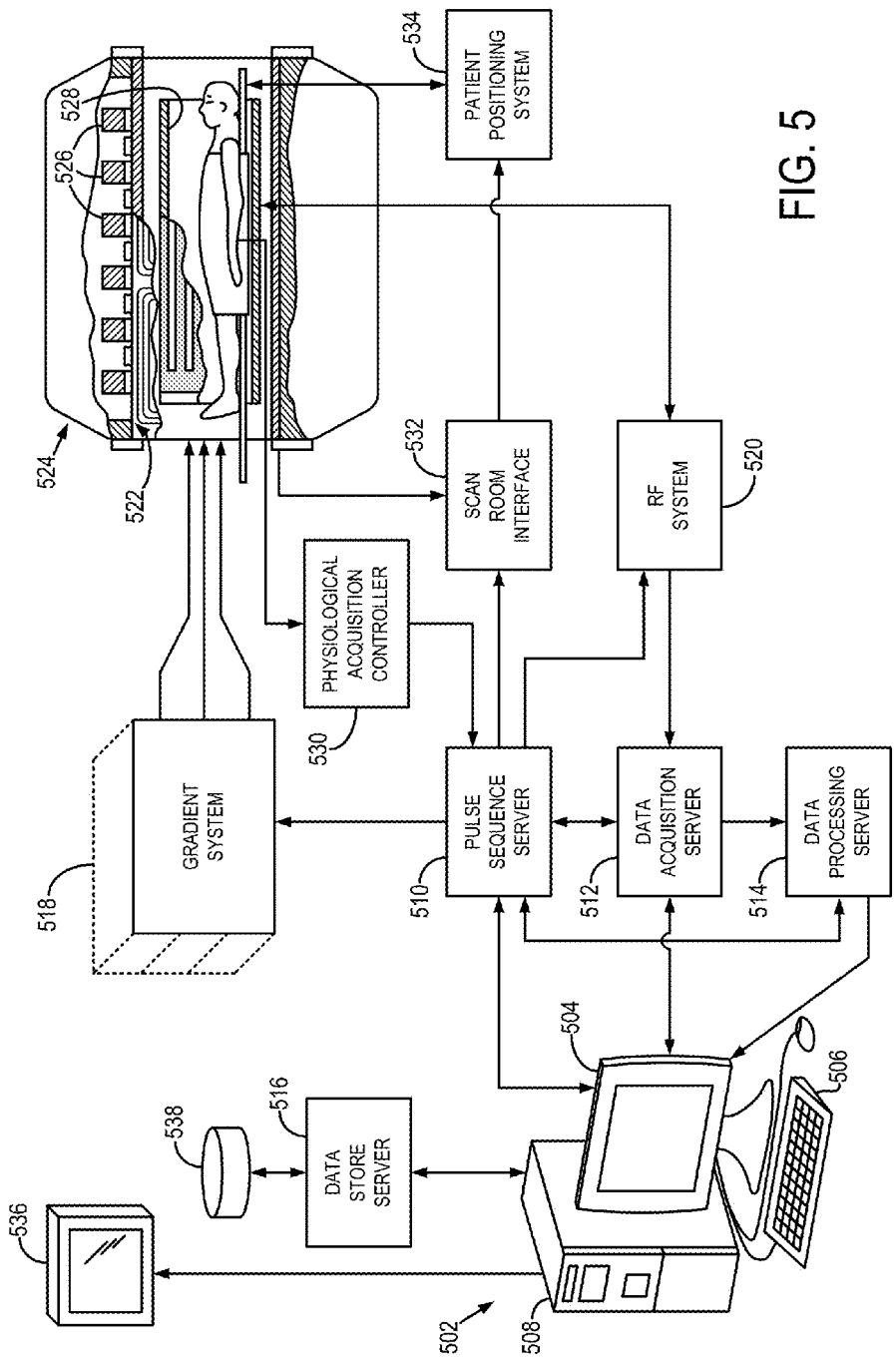
FIG. 5 is a block diagram of an example of a magnetic resonance imaging system, which may employ one or more embodiments of the present invention.

By way of example, the aforementioned image reconstruction methods may be implemented in magnetic resonance imaging applications. Referring particularly now to FIG. 5, an example of a magnetic resonance imaging ("MRI") system 500 is illustrated. The MRI system 500 includes a workstation 502 having a display 504 and a keyboard 506. The workstation 502 includes a processor 508, such as a commercially available programmable machine running a commercially available operating system. The workstation 502 provides the operator interface that enables scan prescriptions to be entered into the MRI system 500. The workstation 502 is coupled to four servers: a pulse sequence server 510; a data acquisition server 512; a data processing server 514; and a data store server 516. The workstation 502 and each server 510, 512, 514, and 516 are connected to communicate with each other.

The pulse sequence server 510 functions in response to instructions downloaded from the workstation 502 to operate a gradient system 518 and a radiofrequency ("RF") system 520. Gradient waveforms necessary to perform the prescribed scan are produced and applied to the gradient system 518, which excites gradient coils in an assembly 522 to produce the magnetic field gradients $G_x$, $G_y$, and $G_z$ used for position encoding MR signals. The gradient coil assembly 522 forms part of a magnet assembly 524 that includes a polarizing magnet 526 and a whole-body RF coil 528.

RF excitation waveforms are applied to the RF coil 528, or a separate local coil (not shown in FIG. 5), by the RF system 520 to perform the prescribed magnetic resonance pulse sequence. Responsive MR signals detected by the RF coil 528, or a separate local coil (not shown in FIG. 5), are received by the RF system 520, amplified, demodulated, filtered, and digitized under direction of commands produced by the pulse sequence server 510. The RF system 520 includes an RF transmitter for producing a wide variety of RF pulses used in MR pulse sequences. The RF transmitter is responsive to the scan prescription and direction from the pulse sequence server 510 to produce RF pulses of the desired frequency, phase, and pulse amplitude waveform. The generated RF pulses may be applied to the whole body RF coil 528 or to one or more local coils or coil arrays (not shown in FIG. 5).

The RF system 520 also includes one or more RF receiver channels. Each RF receiver channel includes an RF amplifier that amplifies the MR signal received by the coil 528 to which it is connected, and a detector that detects and digitizes the I and Q quadrature components of the received MR signal. The magnitude of the received MR signal may thus be determined at any sampled point by the square root of the sum of the squares of the I and Q components:

$$M = \sqrt{I^2 + Q^2} \quad (36);$$

and the phase of the received MR signal may also be determined:

$$\varphi = \tan^{-1}\left(\frac{Q}{I}\right). \quad (37)$$

The pulse sequence server 510 also optionally receives patient data from a physiological acquisition controller 530. The controller 530 receives signals from a number of different sensors connected to the patient, such as electrocardiograph ("ECG") signals from electrodes, or respiratory signals from a bellows or other respiratory monitoring device. Such signals are typically used by the pulse sequence server 510 to synchronize, or "gate," the performance of the scan with the subject's heart beat or respiration.

The pulse sequence server 510 also connects to a scan room interface circuit 532 that receives signals from various sensors associated with the condition of the patient and the magnet system. It is also through the scan room interface circuit 532 that a patient positioning system 534 receives commands to move the patient to desired positions during the scan.

The digitized MR signal samples produced by the RF system 520 are received by the data acquisition server 512. The data acquisition server 512 operates in response to instructions downloaded from the workstation 502 to receive the real-time MR data and provide buffer storage, such that no data is lost by data overrun. In some scans, the data acquisition server 512 does little more than pass the acquired MR data to the data processor server 514. However, in scans that require information derived from acquired MR data to control the further performance of the scan, the data acquisition server 512 is programmed to produce such information and convey it to the pulse sequence server 510. For example, during prescans, MR data is acquired and used to calibrate the pulse sequence performed by the pulse sequence server 510. Also, navigator signals may be acquired during a scan and used to adjust the operating parameters of the RF system 520 or the gradient system 518, or to control the view order in which k-space is sampled. The data acquisition server 512 may also be employed to process MR signals used to detect the arrival of contrast agent in a magnetic resonance angiography ("MRA") scan. In all these examples, the data acquisition server 512 acquires MR data and processes it in real-time to produce information that is used to control the scan.

The data processing server 514 receives MR data from the data acquisition server 512 and processes it in accordance with instructions downloaded from the workstation 502. Such processing may include, for example: Fourier transformation of raw k-space MR data to produce two or three-dimensional images; the application of filters to a reconstructed image; the performance of a backprojection image reconstruction of acquired MR data; the generation of functional MR images; and the calculation of motion or flow images.

Images reconstructed by the data processing server 514 are conveyed back to the workstation 502 where they are stored. Real-time images are stored in a data base memory cache (not shown in FIG. 5), from which they may be output to operator display 512 or a display 536 that is located near the magnet assembly 524 for use by attending physicians. Batch mode images or selected real time images are stored in a host database on disc storage 538. When such images have been reconstructed and transferred to storage, the data processing server 514 notifies the data store server 516 on the workstation 502. The workstation 502 may be used by an operator to archive the images, produce films, or send the images via a network to other facilities.

The present invention has been described in terms of one or more preferred embodiments, and it should be appreciated that many equivalents, alternatives, variations, and modifications, aside from those expressly stated, are possible and within the scope of the invention.

The invention claimed is:

1. A method for reconstructing a series of images of a subject with a medical imaging system, the steps of the method comprising:
   a) acquiring medical image data from the subject with a medical imaging system; and
   b) reconstructing a series of images of the subject from the acquired medical image data set while constraining individual images in the series of images to be consistent with a signal model that describes a dependency of image intensity values to at least one variable that is associated with a physical property of the subject.

2. The method as recited in claim 1 in which the signal model is at least one of an analytical signal model and an approximate signal model generated from previously acquired medical image data.

3. The method as recited in claim 2 in which the signal model is an approximate signal model generated from the medical image data acquired in step a).

4. The method as recited in claim 3 in which the approximate signal model is generated from a series of low-resolution images reconstructed from the medical image data acquired in step a).

5. The method as recited in claim 4 in which the approximate signal model is learned from the reconstructed series of low-resolution images by:
   i) forming an image intensity vector for each pixel location in an image matrix;
   ii) forming a dictionary matrix from the image intensity vectors;
   iii) compressing the dictionary matrix to a number of representative basis functions;
   iv) forming an operator from the representative basis functions; and
   v) using the operator to constrain the reconstruction of the series of image to be consistent with the approximate signal model.

6. The method as recited in claim 5 in which the medical image data acquired in step a) is representative of a time series of images obtained during a time period in which the medical image data is acquired and in which the image intensity vector formed in step b)i) for each pixel location is representative of a waveform of image intensity changes during the time period.

7. The method as recited in claim 5 in which step b)iii) includes compressing the dictionary matrix using at least one of principal components analysis and a k-SVD algorithm.

8. The method as recited in claim 5 in which the operator formed in step b)iv) is a linear operator and step b) includes minimizing an objective function that includes a term that computes a difference between an image estimate and a result of applying the linear operator to a result of applying a pseudoinverse of the linear operator to the image estimate.

9. The method as recited in claim 5 in which the operator formed in step b)iv) is a linear operator and step b) includes minimizing an objective function that includes a term that computes a difference between an image estimate and a result of applying the linear operator to a result of applying an adjoint of the linear operator to the image estimate.

10. The method as recited in claim 2 in which the signal model is an approximate signal model and step b) includes:
    i) forming a dictionary matrix from analytical signal models sampled on a dense grid of admissible values of quantitative parameters;
    ii) compressing the dictionary matrix to a number of representative basis functions;
    iii) forming an operator from the representative basis functions; and
    iv) using the operator to constrain the reconstruction of the series of image to be consistent with the approximate signal model.

11. The method as recited in claim 2 in which the signal model is an analytical signal model that is dependent on at least one control parameter of the medical imaging system.

12. The method as recited in claim 11 in which the medical imaging system is a magnetic resonance imaging system, and in which the at least one control parameter includes at least one of an echo time, a repetition time, an inversion recovery time, and a flip angle.

13. The method as recited in claim 11 in which the analytical signal model includes a plurality of signal models associated with different values of the at least one control parameter.

14. The method as recited in claim 13 in which step b) includes computing an operator from the analytical signal model and using the operator to constrain the reconstruction of the images to be consistent with the analytical signal model.

15. The method as recited in claim 14 in which computing the operator includes calculating principal components from the analytical signal model and computing the operator using the calculated principal components.

16. The method as recited in claim 14 in which the operator is a linear operator.

17. The method as recited in claim 1 in which step b) includes constraining the images to be consistent with the signal model by computing a difference between an estimate of the images and a projection of the estimate of the images onto a space of all functions that satisfy the signal model.

18. The method as recited in claim 1 in which the medical imaging system is a magnetic resonance imaging (MRI) system and in which the at least one variable includes at least one of a longitudinal relaxation time, a transverse relaxation time, an apparent transverse relaxation time, a magnetization value, a magnetization transfer parameter, a diffusion coefficient, a fat signal component, a water signal component, and a field map value.

19. The method as recited in claim 1 in which step b) includes constraining the images to have a same phase value by projecting the images on a space of all images with the phase value, and in which the phase value is at least one of determined from at previously acquired data and calculated iteratively from the data acquired in step a).

20. The method as recited in claim 1 in which the at least one variable that is associated with a physical property of the subject is at least one of a data acquisition time associated with at least one of a location of the subject at that data acquisition time, a contrast value at that data acquisition time, and a flow value at that data acquisition time.

\* \* \* \* \*